United States Patent [19]
Inoue

[11] Patent Number: 5,940,734
[45] Date of Patent: Aug. 17, 1999

[54] METHOD OF FABRICATING A WIRING ON A PLANARIZED SURFACE

[75] Inventor: Yushi Inoue, Hamamatsu, Japan

[73] Assignee: Yamaha Corporation, Japan

[21] Appl. No.: 08/982,832

[22] Filed: Dec. 2, 1997

[30] Foreign Application Priority Data

Dec. 2, 1996 [JP] Japan .................................. 8-336435

[51] Int. Cl.⁶ .............................................. H01L 21/4763
[52] U.S. Cl. .......................... 438/781; 438/781; 438/623; 438/624; 438/631; 438/632; 438/699; 438/760
[58] Field of Search ..................................... 438/624, 631, 438/632, 699, 781, 739, 760, 780, 623, 621

[56] References Cited

U.S. PATENT DOCUMENTS

| | | | |
|---|---|---|---|
| 4,654,113 | 3/1987 | Tuchiya et al. .......................... | 156/643 |
| 5,506,177 | 4/1996 | Kishimoto et al. ...................... | 438/624 |
| 5,518,962 | 5/1996 | Murao ..................................... | 438/699 |
| 5,552,346 | 9/1996 | Huang et al. ............................ | 438/699 |
| 5,607,880 | 3/1997 | Suzuki et al. ............................ | 438/624 |

OTHER PUBLICATIONS

Wolf, Stanley, Silicon Processing for the VLSI Era, vol. 2, p. 232, 1990.

*Primary Examiner*—Charles Bowers
*Assistant Examiner*—Thanh Nguyen
*Attorney, Agent, or Firm*—Ostrolenk, Faber, Gerb & Soffen, LLP

[57] ABSTRACT

An insulating film 16, made of BPSG, etc., is formed on a substrate 10 by CVD, covering an uneven surface, and then is subjected to thermal treatment to fluidize the film and to reduce the step. Hydrogen silsesquioxane resin solution is coated on the film 16 by spin coating, subjected to the first annealing at a relatively low temperature, and then to the second annealing at relatively high temperature, to form a glass film 18. The lamination of the films 16 and 18 is etched back under the dry etching conditions where the etch rates of the films 16 and 18 become approximately equal, until film 18 is completely removed, to planarize the film 16. A wiring is formed on the planarized surface. The surface of the insulating film serving as an underlying layer of a wiring can be planarized uniformly and with good reproducibility.

14 Claims, 7 Drawing Sheets

METHOD OF FABRICATING A WIRING ON A PLANARIZED SURFACE

This application is based on Japanese Patent Application Number 8-336435, filed on Dec. 2, 1996, the entire contents of which are incorporated herein by reference.

BACKGROUND OF THE INVENTION a) Field of the Invention

This invention relates to a method of fabricating a wiring, and more particularly to a method of fabricating a wiring on a planarized insulating film adapted for fabricating a wiring in a large scale integrated circuit (LSI).

b) Description of Related Art

Conventionally, those methods as shown in FIGS. 11 and 12 are known as the method of fabricating a wiring on a planarized insulating film in LSI (for example, refer to JP-A 6-140387).

Referring to FIG. 11, a plurality of MOS transistors are formed on the surface of a semiconductor substrate 1, by the well-known method. In the figure, reference numerals 2a and 2b indicate gate insulating films of the first and second MOS transistors, and reference numerals 3a and 3b indicate gate electrode layers of the first and second MOS transistors. The source and drain regions of the first and second MOS transistors are not shown for the brevity of the figure. A silicon oxide film 4 is formed on the surface of the substrate, covering the step-forming structure including the gate electrode layers 3a and 3b, etc., by chemical vapor deposition (CVD). After deposition of the film 4, the substrate is subjected to annealing in $N_2$ atmosphere at 850° C. for 30 minutes, to densify the film 4. The film 4 is conformal to the step-forming structure of the underlying surface, and has an uneven surface.

On the surface of silicon oxide film 4, silanol-containing spin-on-glass (SOG) solution is coated by spin coating to have a flat surface. The coated film is subjected first to a low temperature annealing in air at 150° C. for 1 minute to vaporize the solvent, and then to another low temperature annealing in air at 400° C. for 1 minute. The coated film is not perfectly converted to silicon oxide in this state. Then, the coated film is subjected to a high temperature annealing in $N_2$ atmosphere at 800° C. for 30 minutes. The coated film is then perfectly converted to silicon oxide by this high temperature annealing, to provide a glass film 5 formed of silicon oxide.

If the coated film is directly subjected to the high temperature annealing without subjecting to the low temperature annealing, the glass film 5 may peel off from the silicon film 4 by the rapid contraction of the SOG. For preventing such peeling, the low temperature annealing is performed before the high temperature annealing.

The high temperature annealing is performed to perfectly convert the coated film to silicon oxide. As a result of the high temperature annealing, the etch rate of the glass film 5 in wet etching becomes almost equal to that of the silicon oxide film 4.

A connection hole reaching the gate electrode layer 3a is formed through the silicon oxide film 4. Then, the substrate is subjected to light wet etching by diluted fluoric acid, for removing the native oxide film on the electrode layer 3a in the connection hole. Here, if the glass film 5 has not been subjected to the high temperature annealing, it has a larger etch rate relative to that of the silicon oxide film 4, and may be completely removed by the light wet etching. Therefore, the glass film 5 is subjected to the high temperature annealing to bring the etch rate thereof to be approximately equal to that of the silicon oxide film 4. In this case, when the connection hole is formed and light wet etching by diluted fluoric acid is performed, the flatness of the interlevel insulating film formed of lamination of the films 4 and 5 can be maintained. After the wet etching, a desired wiring layer is formed on the interlevel insulating film.

According to the above-mentioned method of planarizing the insulating film, cracks may be generated in the glass film 5 upon the high temperature annealing. Then, the breakdown voltage of the interlevel insulating film may be degraded.

For avoiding such inconvenience, another planarizing method is proposed, in which the glass film 5 is subjected to only a low temperature annealing below 700° C., without performing any high temperature annealing at a temperature above 700° C., to planarize the film. In this method, the glass film 5 is subjected to a low temperature annealing in the state of FIG. 11. Then, as shown in FIG. 12, the lamination of the films 4 and 5 is etched back by dry etching under the conditions in which the etch rates of the silicon oxide film 4 and the glass film 5 are approximately equal, to planarize the surface of the silicon oxide film 4. After the planarization, the desired connection hole is formed through the insulating film 4, and light wet etching by diluted fluoric acid is performed to remove the native oxide film. Then, a desired wiring layer is formed on the insulating film 4.

According to the above-mentioned planarizing method in which the glass film 5 is not subjected to the high temperature annealing, the range of dry etching conditions which can bring the etching rates of the silicon oxide film 4 and the glass film 5 approximately equal is extremely narrow. Therefore, it was difficult to obtain good uniformity and reproducibility in the etch back treatment. As a countermeasure for this problem, the silicon oxide film 4 may be formed thick and the amount of etch-back may be increased. However, according to this method, the time length for the treatment becomes long and the throughput is lowered.

SUMMERY OF THE INVENTION

An object of this invention is to provide a novel method of fabricating a wiring including a step of planarizing an insulating film, capable of providing good uniformity and reproducibility.

According to an aspect of this invention, there is provided a method of fabricating a wiring, comprising the steps of: (a) providing a substrate having an overlying structure thereon; (b) forming a first interlayer insulating film over the overlying structure; (c) applying a source material to be formed into a second interlayer insulating film over the first interlayer insulating film so as to fill depressions on the first interlayer insulating film; (d) subjecting said source material to a first heat treatment at a first temperature; (e) subjecting said source material to a second heat treatment at a second temperature higher than the first temperature so as to provide the second interlayer insulating film; (f) completely removing the second interlayer insulating film and partially removing the first interlayer insulating film through dry etching so as to provide a flat surface on the first interlayer insulating film wherein the dry etching is performed under a condition that etching rates of the first and second interlayer insulating films are equal; and (g) forming a wiring layer on the flat surface of the first interlayer insulating layer.

According to another aspect of this invention, there is provided a method of fabricating a wiring comprising the steps of: a) providing a substrate having an overlying structure thereon; b) forming a first interlayer insulating film over the overlying structure; c) forming a sacrificial insulating film made from hydrogen silsesquioxane resin over the first interlayer insulating film so as to fill depressions on the first interlayer insulating film; and d) completely removing the sacrificial insulating film and partially removing the first interlayer insulating film through dry etching so as to provide a flat surface on the first interlayer insulating film wherein the dry etching is performed under a condition that etching rates of the first and second interlayer insulating films are equal.

Since the coated film is subjected to the first and second annealing treatment, the range of the dry etching conditions wherein the etch rates of the insulating film and the glass film become approximately equal becomes wide. Therefore, good uniformity and reproducibility can be provide in the etch-back treatment.

DESCRIPTION OF THE PREFERRED EMBODIMENTS

Figure 1:
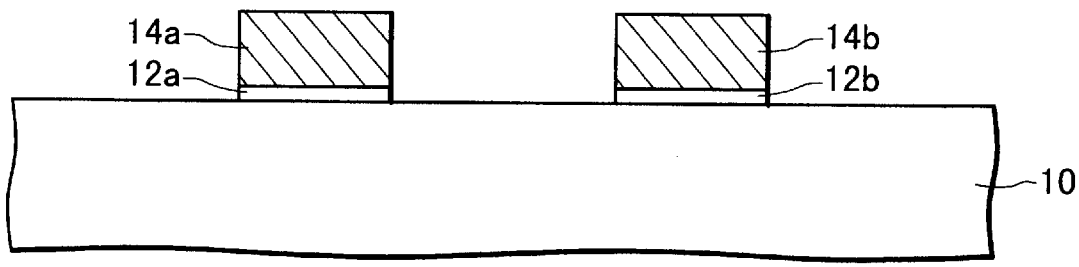
FIG. 1 is a cross sectional view of a substrate, illustrating the step of forming transistors in the wiring fabricating method according to an embodiment of this invention.
Figure 2:
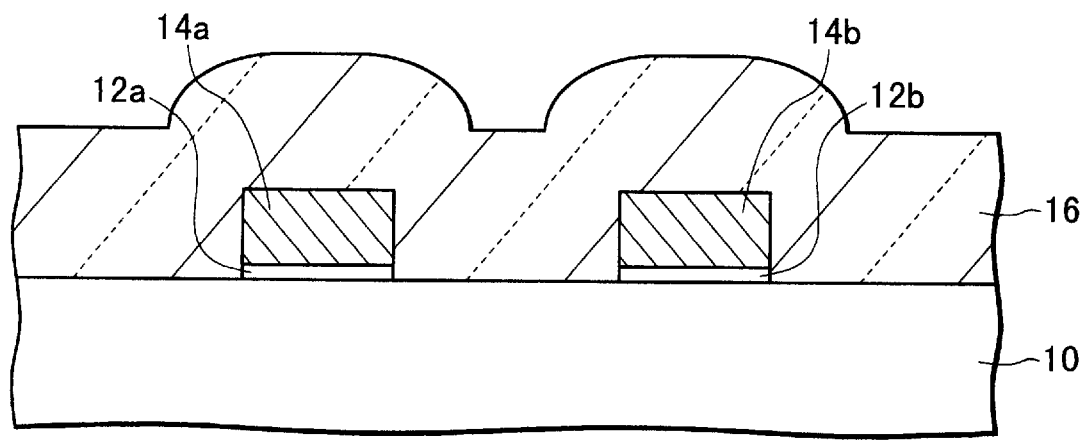
FIG. 2 is a cross-sectional view of the substrate, illustrating the step of forming an insulating film, following the step of FIG. 1.
Figure 3:
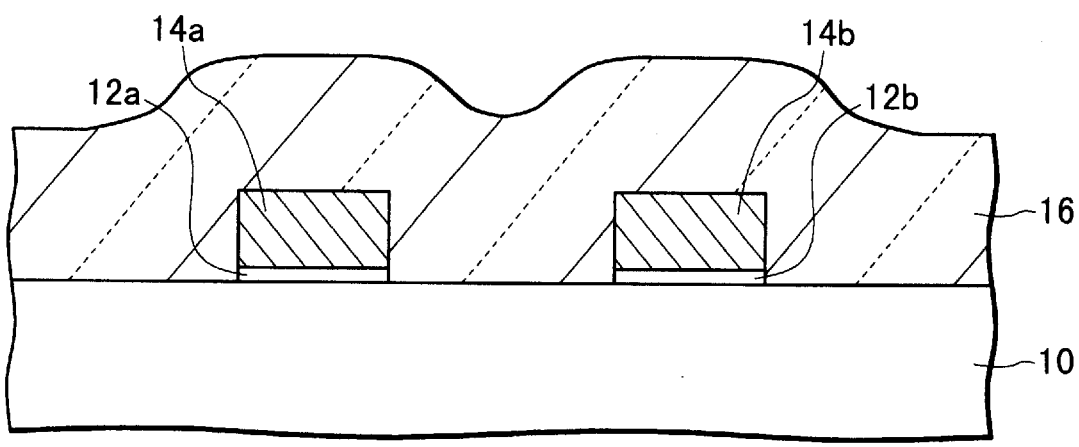
FIG. 3 is a cross-sectional view of the substrate, illustrating the step of reflow treatment following the step of FIG. 2.

FIGS. 1 to 7 show the method of fabricating a wiring according to an embodiment of this invention. The steps (1) to (7) corresponding to FIGS. 1 to 7 will be described hereinbelow.

(1) On a surface of a semiconductor substrate 10, for example made of silicon, a plurality of MOS transistors are formed by the well-known method of silicon gate process. Here, reference numerals 12a and 12b indicate gate insulating films of the first and second MOS transistors, and reference numerals 14a and 14b indicate gate electrode layers of the first and second MOS transistors. The gate insulating films 12a and 12b are, for example, formed of a silicon oxide film. The electrode layers 14a and 14b are, for example, made of a polycrystalline silicon (polysilicon) layer or a polycide layer (lamination of a polysilicon layer and a silicide layer formed on the polysilicon layer). The source and drain regions of the first and second MOS transistors are not shown for the brevity of the drawing. Regarding the general knowledge of the MOS transistors, reference may be made to U.S. Pat. No. 5,534,461 or U.S. Pat. No. 5,457,070, which are incorporated herein by reference.

(2) An insulating film 16 is formed on the surface of the substrate by CVD, covering the step-forming structure of the gate electrode layers 14a, 14b, etc. As the insulating film 16, borophosphosilicate glass (BPSG) or phosphosilicate glass (PSG) may be employed. The conditions of forming a BPSG film by normal pressure CVD are, for example:

substrate temperature: 400° C., pressure: 1 atm, and source gas: $SiH_4$ (46.25 sccm)+$PH_3$ (8.75 sccm) +$B_2H_6$ (7.5 sccm)+$O_2$ (7000 sccm) +$N_2$ (50000 sccm).

The conditions of forming a PSG film by normal pressure CVD are, for example:

substrate temperature: 400° C., pressure: 1 atm, and source gas: $SiH_4$ (240 sccm)+$PH_3$ (70 sccm) +$N_2O$ (5000 sccm)+$N_2$ (2730 sccm).

(3) The insulating film 16 is subjected to reflow treatment, to fluidize the insulating film 16 and reduce the step of the insulating film 16. The reflow treatment may be done, using a rapid thermal annealing (RTA) system such as a lamp annealing system. The conditions of this thermal treatment, for example, are:

time length for increasing the temperature to 950° C.: 10 seconds, and the time length of maintaining 950° C.: 10 seconds.

(4) A glass film 18 is formed on the insulating film 16, to have a flat surface by using a source material to be formed into an interlayer insulating film through following process. An example of this process is as follows. Solution formed by dissolving hydrogen silsesquioxane (HSQ) resin $(HSi_{3/2})_n$ in methyl-isobuthyl-ketone (MIBK) is coated on the surface of the substrate by spin coating, to have a flat surface. The condition of this coating step, for example, are:

revolution speed: 5000 rpm, time length of spin coating: 30 seconds, and thickness of the coated film: about 300 nm.

The coated film is first subjected to low temperature annealing. This low temperature annealing is done for removing the solvent, and to cause glass transition. The low temperature annealing, for example, can be done under the following conditions. First, the substrate is subjected to hot plate baking in an inert gas atmosphere, comprising 150° C.–60 seconds+200° C.–60 seconds+300° C.–60 seconds, and then is annealed in a vertical furnace in an inert gas atmosphere at 400° C. for 60 minutes. As a result, the coated film becomes a silicon oxide film of pre-ceramic state (the state which is insoluble to organic solvent, but has insufficient crosslinking).

Then, high temperature annealing at a temperature above 700° C. is performed to the coated film. This high temperature annealing is done for removing water content and causing glass transition, and may be done under the following conditions. The substrate is heated to 850° C. in 10 seconds in an oxidizing atmosphere, and then is kept at 850°

C. for 10 seconds in a RTA system. As a result, a glass film 18 formed of silicon oxide of ceramic state is provided.

(5) The lamination of the insulating film 16 and the glass film 18 is subjected to an etch back treatment to remove the glass film 18, and to form a flat surface of the insulating film 16. Here, the etch back treatment is done under the dry etching conditions where the etch rates of the glass film 18 and the insulating film 16 are approximately equal, till the glass film is completely removed. That is to say, the glass film 18 formed by coating and heating HSQ is a sacrificial film to be completely removed by the etch-back step. When the etch back step is performed in a parallel plate plasma etcher, the conditions of dry etching, for example, are:

supply gas: $CHF_3+CF_4+He$, pressure: 260 Pa power: 275 W, and gas flow rates: $CHF_3+CF_4=40$ sccm, He=88 sccm.

The $CF_4$ gas serves as an etching species for the silicon oxide film, the $CHF_3$ gas serves as an etching species for the silicon oxide film, and simultaneously serves for adjusting the etching rate and adjusting the shape of the etched object in anisotropic etching. The He gas is introduced for stabilizing the plasma. The ratio of the gas flow rates will be described later.

(6) An insulating film 20 formed of silicon oxide, etc. is formed on the insulating film 16 by CVD. The insulating film 20 constitutes an interlevel insulating film together with the insulating film 16.

(7) A wiring layer formed of Al alloy, etc. is deposited and patterned on the insulating film 20, to form wiring layers 22a to 22c.

Figure 5:
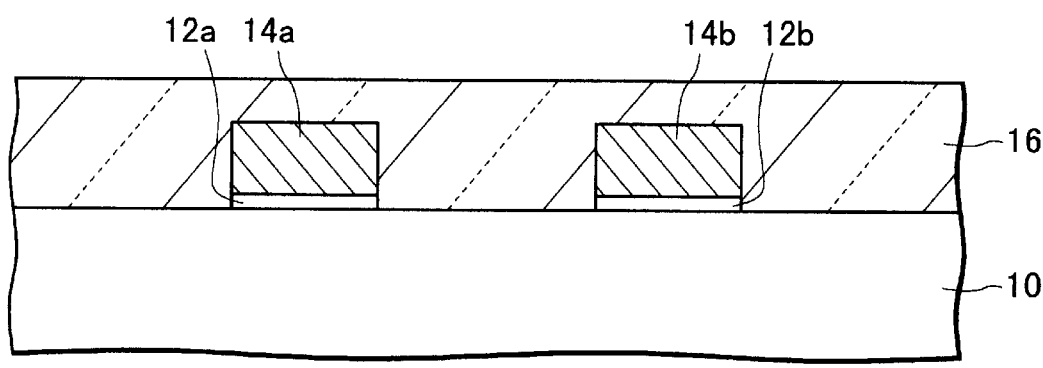
FIG. 5 is a cross-sectional view of the substrate, illustrating the step of etch-back, following the step of FIG. 4.
Figure 6:
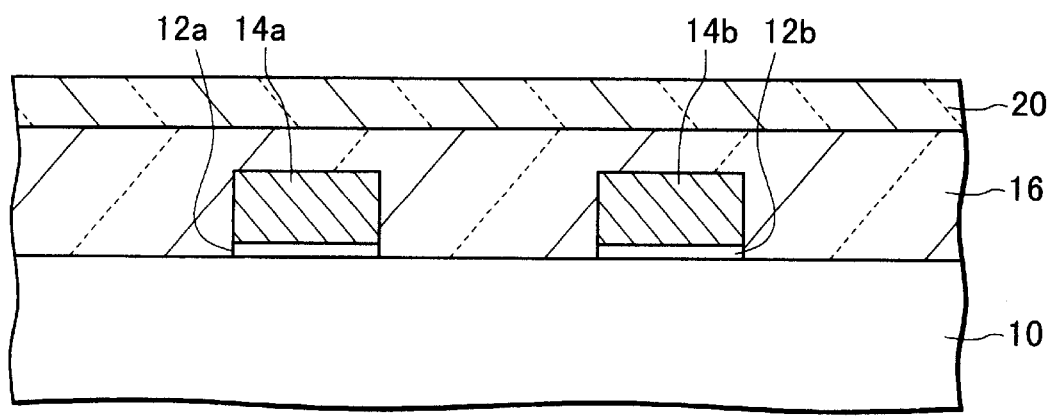
FIG. 6 is a cross-sectional view of the substrate, illustrating the step of forming an insulating film, following the step of FIG. 5.
Figure 7:
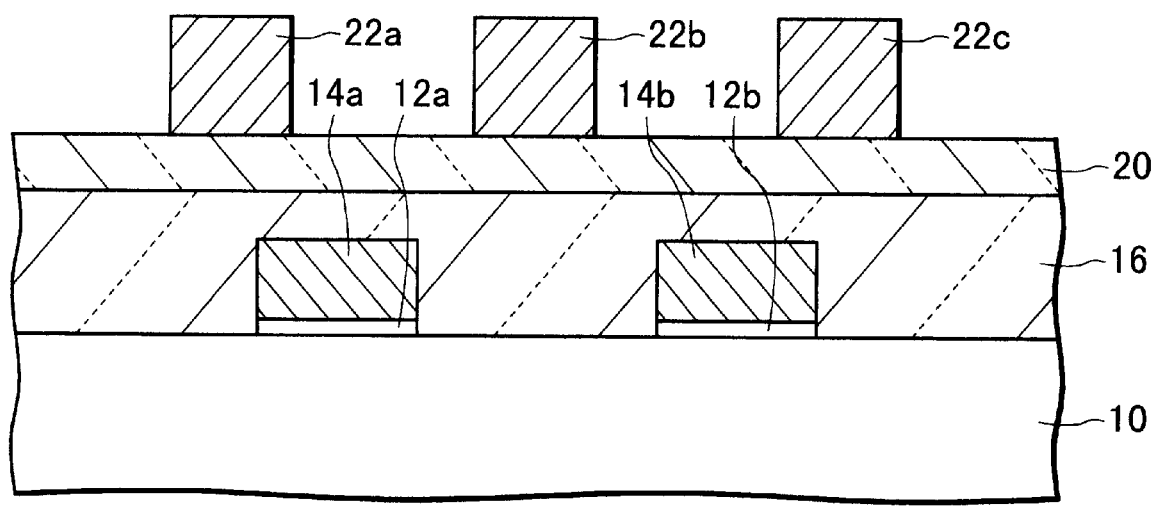
FIG. 7 is a cross-sectional view of the substrate, illustrating the step of forming a wiring, following the step of FIG. 6.
Figure 8:
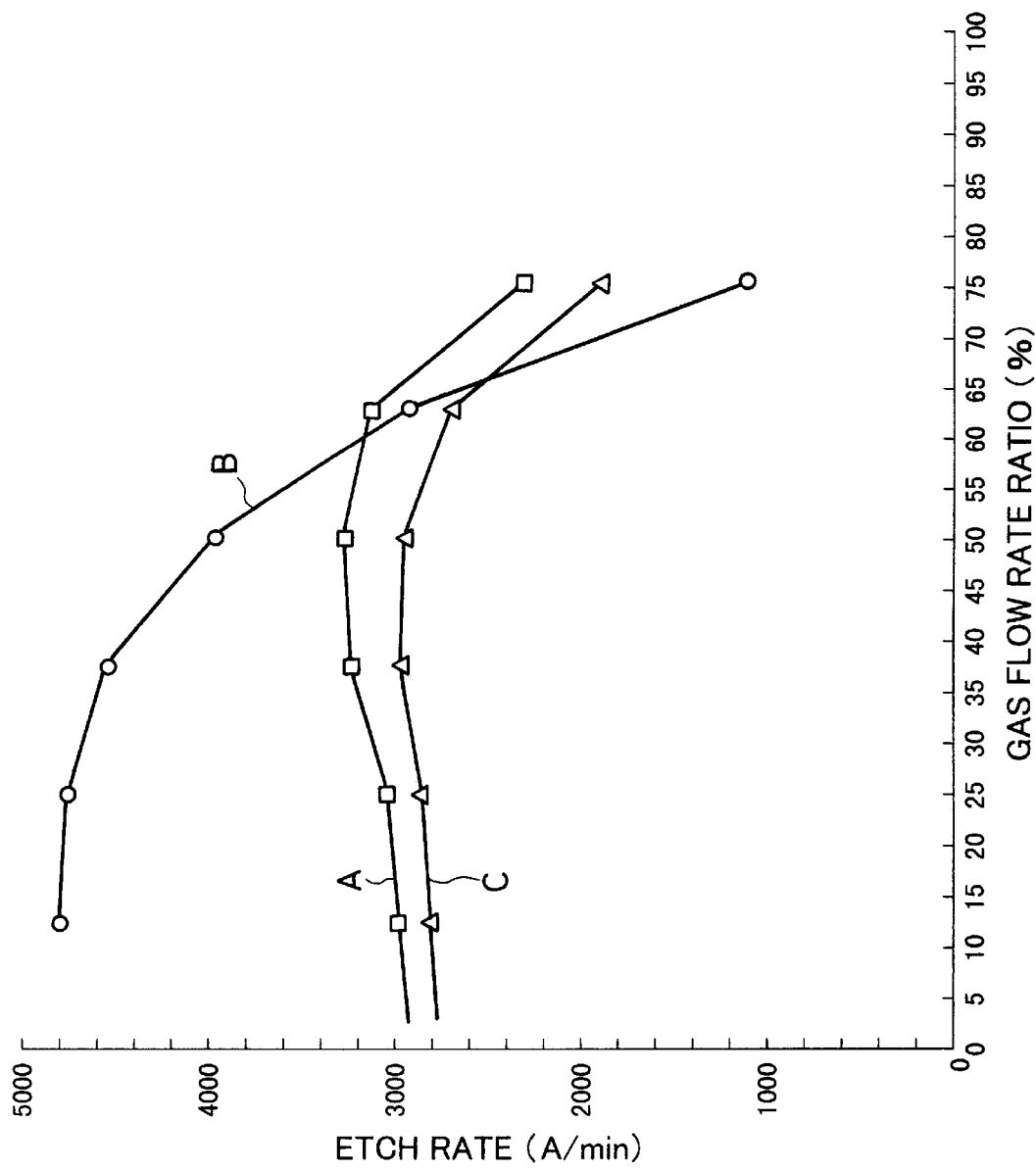
FIG. 8 is a graph showing the dependency of the etch rate upon the gas flow rate ratio.

FIG. 8 shows the result of measurement of etch rate with the gas flow rate ratio being varied in the etch-back step shown in FIG. 5, where the flow rates of $CHF_3+CF_4=40$ sccm and He=88 sccm are kept constant. The gas flow rate ratio can be expressed in the following equation (1) where the gas flow rates of $CHF_3$ and $CF_4$ are represented as $[CHF_3]$ and $[CF_4]$:

$$\{[CHF_3]/([CHF_3]+[CF_4])\} \times 100(\%) \qquad (1).$$

In FIG. 8, curves A, B, and C represent etch rates (A/min) of the samples A, B, and C, respectively. Sample A is prepared by forming the BPSG film by the normal pressure CVD in the step of FIG. 2 as the insulating film 16. and performing lamp annealing treatment at 1000° C. to the BPSG film as the reflow treatment shown in FIG. 3. Sample B is prepared by forming the BPSG film similar to sample A, and forming the coated film of hydrogen silsesquioxane resin solution on the BPSG film as described in connection with FIG. 4, followed by the low temperature annealing treatment comprising the hot plate braking treatment and the furnace annealing treatment at 400° C. Sample C is prepared by using a sample similar to sample B, and performing the high temperature annealing after the low temperature annealing, comprising lamp annealing at 1000° C. to the coated film, to provide the glass film 18. The difference in the etching rate between the coated film and the BPSG film is represented by the difference between the curves B and A, or curves C and A.

Referring to FIG. 8, the etching rate of sample C with a coated film subjected to the low temperature annealing and the high temperature annealing is approximately equal to the etching rate of sample A in the range of the gas flow rate ratio of 25% or less. This means that in sample C, the glass film 18 and the insulating (BPSG) film 16 have approximately the equal etching rates. When the gas flow rate ratio exceeds 25%, the difference between the etching rates of samples A and C increases gradually. The etching rate of sample B with a coated film subjected only to the low temperature annealing, without performing the high temperature annealing, becomes approximately equal to the etching rate of sample A at the gas flow rate ratio of 60% and the neighborhood thereof, i.e. only in an extremely narrow region. This means that in sample B, the etching rates of the coated film and the insulating (BPSG) film 16 become approximately equal only in an extremely narrow region, and differ much outside this very narrow region.

Figure 9:
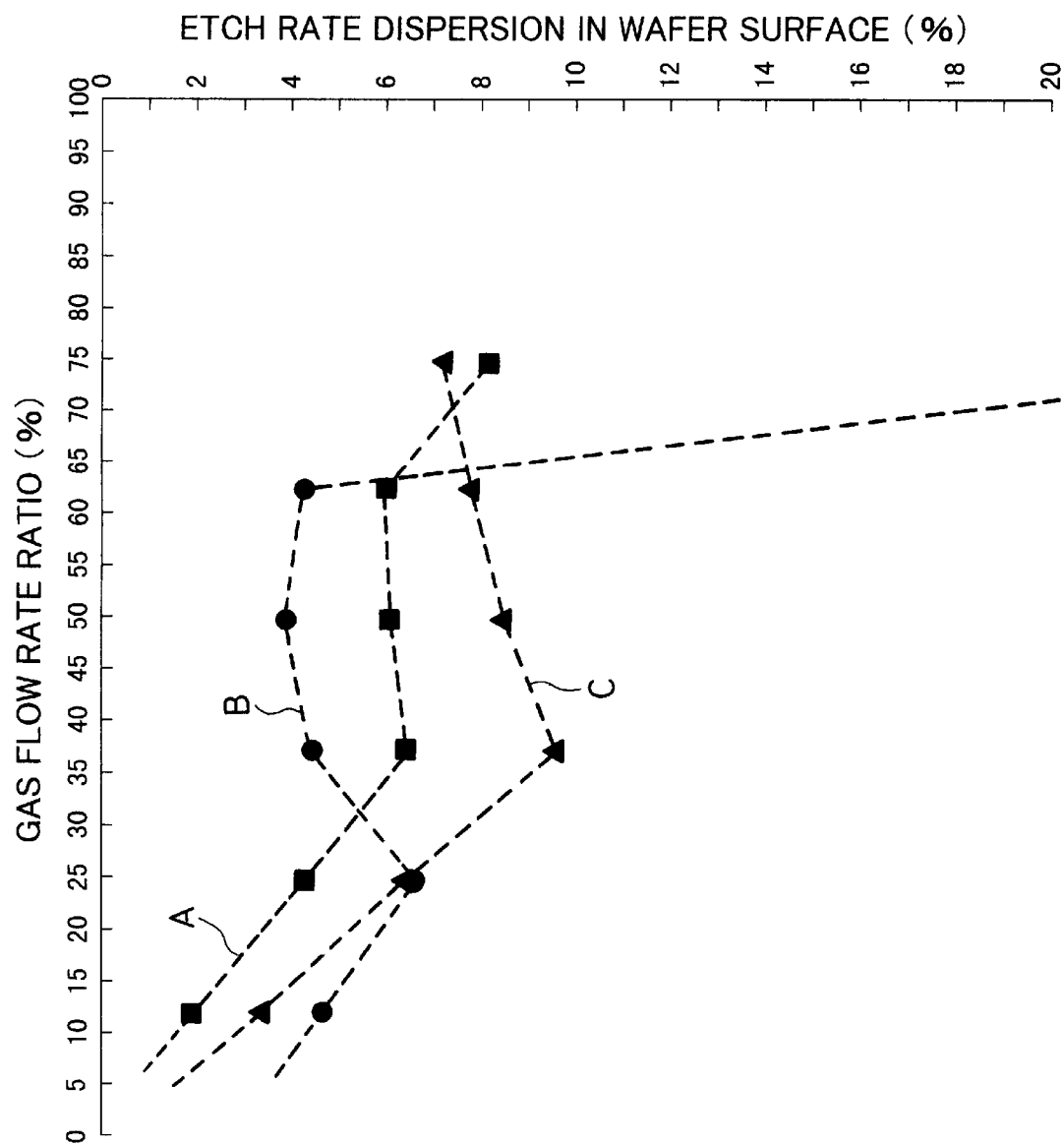
FIG. 9 is a graph showing the dependency of the etch rate dispersion in wafer surface on the gas flow rate ratio.

FIG. 9 shows the result of measurement on the etching rate dispersion in the wafer surface when the gas flow rate ratio is variously varied in the step of etch back as shown in FIG. 5. The gas flow rate ratio is expressed by the equation (1), and the etching rate dispersion in the wafer surface is expressed in the following equation (2):

$$\{([MAX]-[MIN])/(2\times[AVE])\} \times 100 \ (\%) \qquad (2).$$

Figure 10:
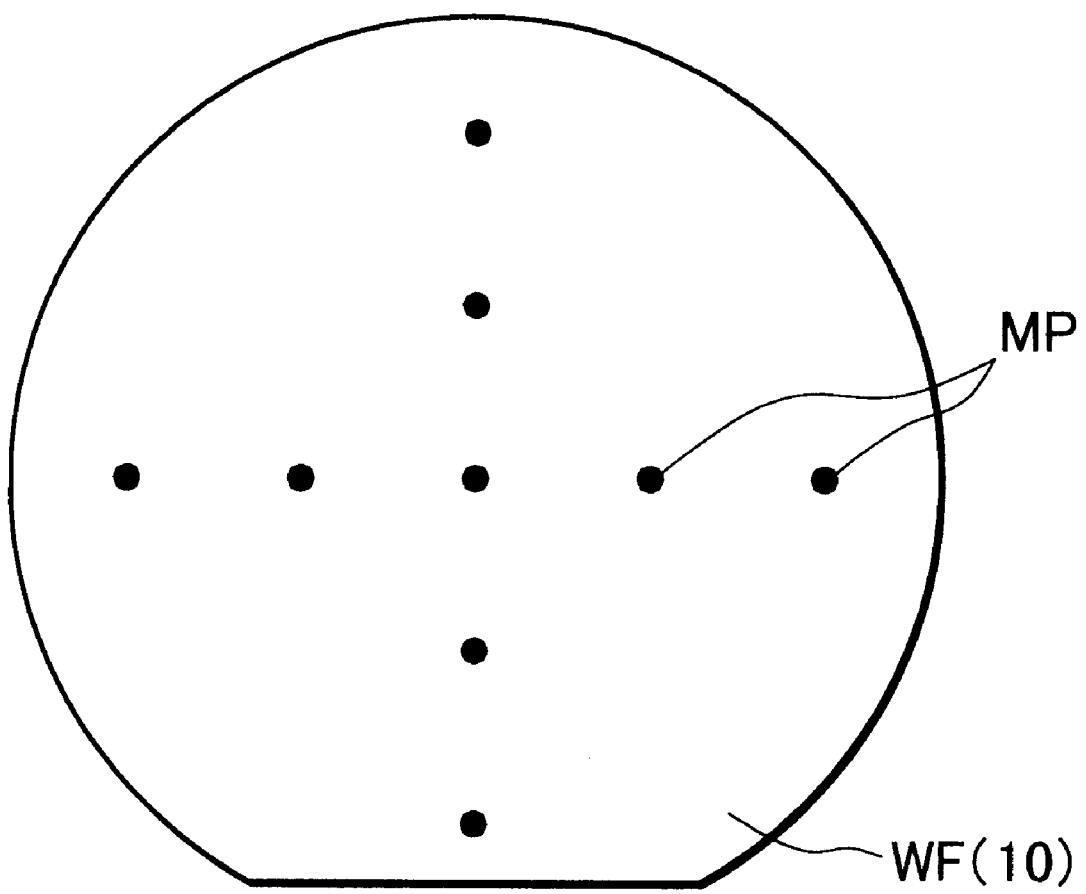
FIG. 10 is a plan view, illustrating points for measuring the etch rate in the wafer surface.
Figure 11:
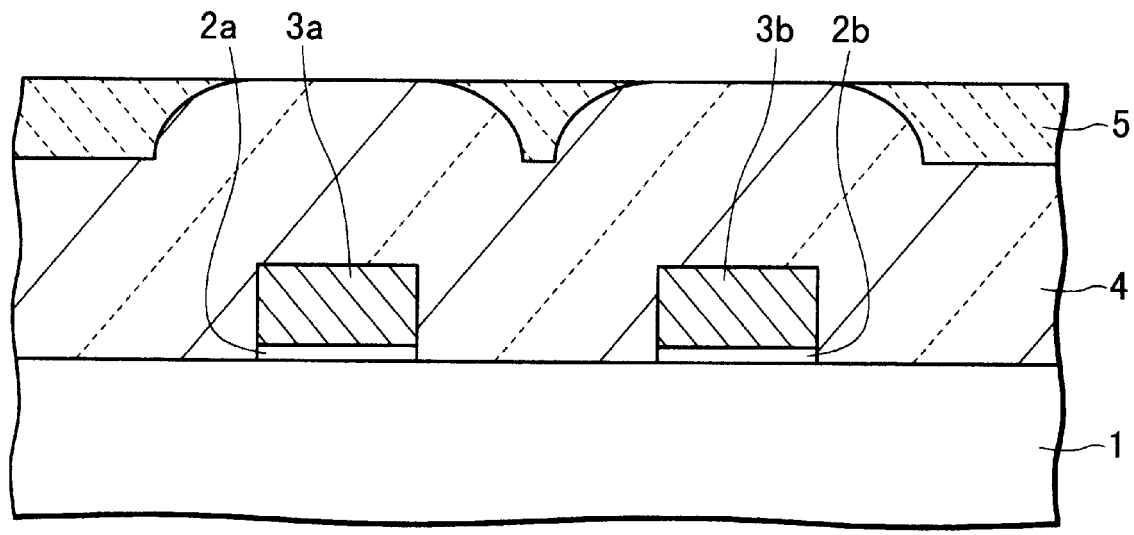
FIG. 11 is a cross-sectional view of a substrate, illustrating the step of forming a glass film according to a conventional method of planarizing an insulating film.
Figure 12:
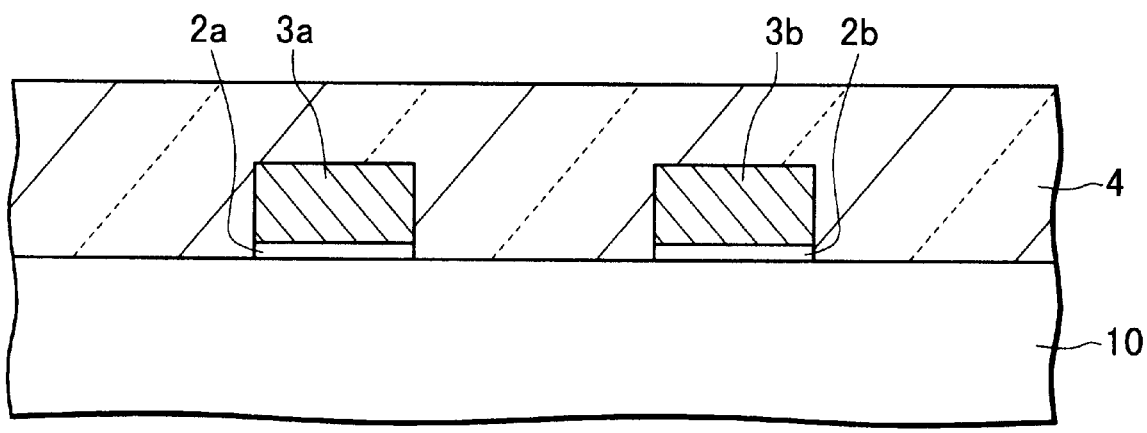
FIG. 12 is a cross sectional view of a substrate, illustrating the etch-back step, following the step of FIG. 11.

Here, [MAX] represents the maximum etch rate, and [MIN] represents the minimum etch rate, with [AVE] representing the averaged etch rate. These etch rates are obtained in the following manner. Nine measuring points MP are defined in the semiconductor wafer WF in a cross-shaped distribution profile as shown in FIG. 10. The etch-back amounts are measured at the respective measuring points MP. The etch rates are obtained on the basis of the measured values. The maximum etching rate among the etching rates at nine measuring points is set as [MAX], the minimum thereof as [MIN], and the average of the etching rates at nine measuring points as [AVE].

FIG. 9 shows the etch rate dispersion in the wafer surface. Curves A, B, and C represent the samples A, B, and C, respectively. Generally, the etch rate dispersion in the wafer surface is desired to be 5% or less. According to FIG. 9, it can be seen that the etch rate dispersion in the wafer surface can be suppressed at about 5% or less, when the gas flow rate ratio is about 20% or less for the respective samples A, B, and C. In the range of the gas flow rate ratio of about 35% to about 60%, the etch rate dispersion for sample B is less than 5%, but the etch rate dispersion for the samples A and C is about 6% or more. Thus, etch-back treatment in this region is not practically good.

Figure 4:
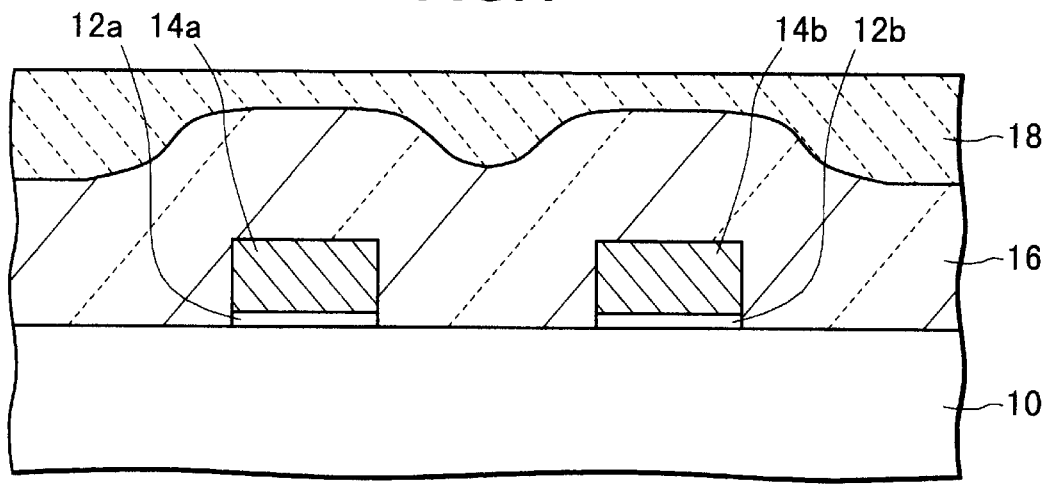
FIG. 4 is a cross-sectional view of the substrate, illustrating the step of forming a glass film, following the step of FIG. 3.

According to the data represented in FIGS. 8 and 9, when the gas flow rate ratio is set about 20% or less, the etch rates of the glass film 18 and the insulating (BPSG) film 16 become approximately equal to each other, the etch rate dispersion in the wafer surface is suppressed within about 5%, and etch-back treatment can be done with good uniformity and reproducibility In the above embodiment, the insulating film 16 is subjected to a reflow treatment to reduce the step. Thus, the coated film (the glass film 18) can be made thin, and no crack generation is observed in the glass film 18 even when it is subjected to a high temperature annealing at a temperature higher than 700° C. in the step of forming the glass film as shown in FIG. 4. In the step of forming the glass film as shown in FIG. 4, the high temperature annealing is performed after the low temperature annealing. Peeling of the glass film 18 can be prevented, and the range of dry etching conditions in the etch-back step as shown in FIG. 5 can be made wide. Therefore, an insulating film with good flatness can be formed with good reproducibility. The throughput can also be improved, compared with the case of forming a thick coated film and etching back the coated film thickly.

Although description has be made on limited embodiments, this invention is not limited thereto. It will be apparent for those skilled in the art that various alterations, modifications, combinations, etc. are possible. For example, the glass film 18 may be formed of other materials than hydrogen silsesquioxane resin, such as organic SOG or inorganic SOG.

What are claimed are:

1. A method of fabricating a wiring, comprising the steps of:
    (a) providing a substrate having an overlaying structure thereon;
    (b) forming a first interlayer insulating film over the overlying structure;
    (c) applying a source material comprising hydrogen silsesquioxane resin to be formed into a second interlayer insulating film over the first interlayer insulating film so as to fill depressions on the first interlayer insulating film;
    (d) subjecting said source material to a first heat treatment at a first temperature of 400° C. or lower;
    (e) subjecting said source material to a second heat treatment in a rapid thermal annealing apparatus at a second temperature higher than the first temperature so as to provide the second interlayer insulating film, said second temperature being at 700° C. or higher;
    (f) completely removing the second interlayer insulating film and partially removing the first interlayer insulating film through dry etching so as to provide a flat surface on the first interlayer insulating film wherein the dry etching is performed under a condition that etching rates of the first and second interlayer insulating films are equal; and
    (g) forming a wiring layer on the flat surface of the first interlayer insulating layer.

2. A method according to claim 1, wherein the first heat treatment is performed in an inert gas atmosphere.

3. A method according to claim 2 wherein the inert gas atmosphere is a nitrogen gas atmosphere.

4. A method according to claim 1, further comprising the step of:
    f-1) after the step f), forming a third interlayer insulating film on the flat surface of the first interlayer insulating film.

5. A method according to claim 1, further comprising:
    b-1) after the step b), reflowing the first interlayer insulating film.

6. A method of fabricating a wiring comprising the steps of:
    a) providing a substrate having an overlying structure thereon;
    b) forming a first interlayer insulating film over the overlying structure;
    c) forming a sacrificial insulating film made of hydrogen silsesquioxane resin over the first interlayer insulating film so as to fill depressions on the first interlayer insulating film;
    d) subjecting the sacrificial insulating film in a rapid thermal annealing apparatus to a first heat treatment performed at a temperature of 400° C. or lower and a second heat treatment performed at a temperature of 700° C. or higher after the first heat treatment; and
    e) completely removing the sacrificial insulating film and partially removing the first interlayer insulating film through dry etching so as to provide a flat surface on the first interlayer insulating film wherein the dry etching is performed under a condition that etching rates of the first and second interlayer insulating films are equal.

7. A method according to claim 6, further comprising the step of:
    e) forming a wiring layer on the flat surface of the first interlayer insulating layer.

8. A method according to claim 6, wherein the first heat treatment is performed in an inert gas atmosphere.

9. A method according to claim 1, wherein said second heat treatment is performed for ten seconds at the second temperature.

10. A method according to claim 6, wherein said second heat treatment is performed for ten seconds at the temperature of 700° C. or higher.

11. A method according to claim 1, wherein said step (b) comprises depositing an insulating film by chemical vapor deposition.

12. A method according to claim 11, wherein said step (b) further comprises reflowing the deposited insulating film by rapid thermal annealing to form the first interlayer insulating film.

13. A method according to claim 6, wherein said step (b) comprises depositing an insulating film by chemical vapor deposition.

14. A method according to claim 13, wherein said step (b) further comprises reflowing the deposited insulating film by rapid thermal annealing to form the first interlayer insulating film.

* * * * *